(12) United States Patent
Lagler et al.

(10) Patent No.: US 11,119,151 B2
(45) Date of Patent: Sep. 14, 2021

(54) METHOD FOR IDENTIFYING AND COMPENSATING FOR SYSTEMS ERRORS

(71) Applicant: Rohde & Schwarz GmbH & Co. KG, Munich (DE)

(72) Inventors: Andreas Lagler, Munich (DE); Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/700,778

(22) Filed: Dec. 2, 2019

(65) Prior Publication Data
US 2021/0165041 A1 Jun. 3, 2021

(51) Int. Cl.
*G01R 31/00* (2006.01)
*G01R 31/3177* (2006.01)
*G01R 31/317* (2006.01)

(52) U.S. Cl.
CPC ... *G01R 31/3177* (2013.01); *G01R 31/31705* (2013.01)

(58) Field of Classification Search
None
See application file for complete search history.

(56) References Cited

U.S. PATENT DOCUMENTS

| | | | | |
|---|---|---|---|---|
| 4,644,486 A * | 2/1987 | Cannon | | G01R 27/28 324/76.13 |
| 5,051,916 A * | 9/1991 | Benson | | G01R 23/16 702/76 |
| 8,841,923 B1 * | 9/2014 | Vanwiggeren | | G01R 27/32 324/606 |
| 2003/0051086 A1 * | 3/2003 | Smith | | G06F 11/24 710/106 |
| 2020/0341052 A1 * | 10/2020 | Barthel | | G01R 31/2841 |

FOREIGN PATENT DOCUMENTS

EP 0216941 A1 4/1987

OTHER PUBLICATIONS

Rik Pintelon; Johan Schoukens, "Design of Excitation Signals," in System Identification: A Frequency Domain Approach , IEEE, 2012, pp. 151-175, doi: 10.1002/9781118287422.ch5. (Year: 2012).*

* cited by examiner

*Primary Examiner* — Daniel F. McMahon
(74) *Attorney, Agent, or Firm* — Christensen O'Connor Johnson Kindness PLLC

(57) ABSTRACT

A method for at least one of identifying and compensating for system errors in a measurement system is disclosed, wherein the measurement system comprises a signal generator and a signal analyzer. The method comprises: generating a test signal via the signal generator, the test signal having predetermined properties; forwarding the test signal to a device under test; processing the test signal via the device under test, thereby generating a transmission signal; receiving the transmission signal via the signal analyzer; determining a response function of the device under test based on the test signal and based on the transmission signal; and determining at least one periodic component of the response function. Further, a measurement system as well as a calibration system are disclosed.

20 Claims, 2 Drawing Sheets

METHOD FOR IDENTIFYING AND COMPENSATING FOR SYSTEMS ERRORS

FIELD OF THE DISCLOSURE

Embodiments of the present disclosure generally relate to a method for at least one of identifying and compensating for system errors in a measurement system. Embodiments of the present disclosure further relate to a measurement system and to a calibration system.

BACKGROUND

In many applications, electrical devices need to be tested before their actual use in order to identify and/or remove errors in the electrical device.

One well-known category of tests are so-called transmission measurements wherein a device under test is supplied with a known test signal and a corresponding output signal of the device under test is measured by means of a measurement system.

However, errors may occur in these transmission measurements due to reflections that occur during the respective measurements. Generally speaking, such reflections occur due to impedance mismatches within the measurement system. Hence, these errors are also called system errors as they relate to the measurement system.

A known way to identify these system errors is to use a vector network analyzer having several receivers and directional elements. With such vector network analyzers, the reflections occurring during the transmission measurements can be measured directly. However, measurement systems involving a vector network analyzer are rather costly.

Thus, there is a need for an alternative way to identify and compensate system errors in transmission measurements of a device under test, particularly in a cost-efficient manner.

SUMMARY

Embodiments of the present disclosure provide a method for identifying and/or compensating for system errors in a measurement system. In an embodiment, the measurement system comprises a signal generator and a signal analyzer. The method in some embodiments comprises the following steps: A test signal is generated via the signal generator, wherein the test signal has predetermined properties. The test signal is forwarded to a device under test. The test signal is processed via the device under test, thereby generating a transmission signal. The transmission signal is received via the signal analyzer. A response function of the device under test is determined based on the test signal and based on the transmission signal. At least one periodic component of the response function is determined.

Generally speaking, the response function describes a response of the device under test to the test signal when being processed by the device under test. In other words, the response function comprises information on a correlation between an output signal of the device under test and an input signal of the device under test.

The method according to the disclosure is based on the finding that system errors due to reflections in the measurement system are associated with periodic components in the determined response function. The determined response function is not the actual response function of the device under test alone, but rather comprises contributions from the system errors, for example from reflections in the measurement system. Accordingly, by identifying the periodic components of the response function, the system errors are identified appropriately.

The method according to the disclosure is based on determining the response function via a single receiver, i.e. the signal analyzer. Thus, there is no need for additional receivers, additional directional elements and/or for a vector network analyzer yielding a cost-efficient measurement system. Put differently, a particularly simple and cost-saving method for identifying the system errors is provided.

The signal generator may be established as a vector signal generator being configured to generate a test signal with a predefined amplitude and phase.

The signal analyzer may be established as a vector signal analyzer being configured to determine an amplitude and a phase of a signal received by the signal analyzer.

In some embodiments, the signal analyzer is not established as a vector network analyzer. In other words, the measurement system only comprises a single receiver, namely the signal analyzer.

According to one aspect of the present disclosure, the response function is a frequency response and/or a transfer function. If the device under test exhibits a linear time invariant behavior, usually the frequency response of the device under test is determined. If the device under test deviates from the linear time invariant behavior, the transfer function is more appropriate to describe the behavior of the device under test.

According to a further aspect of the present disclosure, a transformed response function is determined in order to determine the at least one periodic component, the transformed response function being a Fourier transform or a Laplace transform of the response function. Note that the response function is a function in frequency domain. Accordingly, both the Fourier transform and the Laplace transform of the response function may be functions in time domain. Periodic components of the response function thus have certain "frequencies", also called periodic repetitions, because the frequency composition of a function in frequency domain is described by its Fourier transform or Laplace transform.

According to another aspect of the present disclosure, an amplitude response, a phase response and/or a group delay is determined based on the response function. Then, a Fourier transform or a Laplace transform of the amplitude response, the phase response and/or the group delay is determined in order to determine at least one periodic component of the amplitude response, the phase response and/or the group delay. System errors due to reflections in the measurement system are associated with periodic components in the determined amplitude response, the determined phase response and/or the determined group delay. Accordingly, by identifying the periodic components of the amplitude response, the phase response and/or the group delay, the system errors are identified appropriately. In one embodiment of the present disclosure, a peak search is performed on the transformed response function, thereby determining peak positions of peaks in the transformed response function. Periodic components of the response function in frequency domain are associated with peaks of the Fourier transformed response function and/or the Laplace transformed response function. Any known and/or suitable peak search algorithm may be used in order to identify peaks in the transformed response function.

For example, the peaks may be identified by searching the Fourier transformed response function and/or the Laplace transformed response function for local maxima and/or for global maxima. In other words, the peaks may be identified by searching for the highest values of the Fourier transformed response function and/or the Laplace transformed response function.

Additionally or alternatively, the peaks may be identified by analyzing a percentage of total area under a graph of the Fourier transformed response function and/or the Laplace transformed response function. This property can be used to identify the peaks because, generally speaking, the percentage of total area under a graph is higher in the region where a peak of the Fourier transformed response function and/or of the Laplace transformed response function is located.

At least one of an electrical length and a mechanical length, namely the electrical length and/or the mechanical length, of at least one component of the measurement system may be determined based on the determined peak positions. Accordingly, a phase shift (electrical length) caused by the reflections and/or a distance that a signal has to travel due the reflections is determined.

In some embodiments, the at least one of the electrical length and the mechanical length is displayed on a display of the measurement system. This may help a user with identifying the source of a system error. For example, if the determined mechanical length associated with a peak is 0.5 m, it is highly probable that the source of the associated reflection is a cable in the measurement system.

According to another aspect of the present disclosure, the response function is filtered with a frequency selective filter in order to remove predetermined frequency ranges from the response function. Accordingly, the contributions of the system errors, particularly of the reflections in the measurement system, are removed from the determined response function, thereby recovering the actual response function of the device under test.

The frequency selective filter may be established as a band-pass filter having a predetermined bandwidth or as a low-pass filter having a predetermined bandwidth Accordingly, the contributions of the system errors in the predetermined bandwidth, particularly of the reflections in the measurement system, are removed from the determined response function, thereby recovering the actual response function of the device under test.

According to another aspect of the present disclosure, the frequency selective filter is established as at least one of hardware and software. In other words, the frequency selective filter may be established as a pure hardware filter, as a pure software filter or as a combination of suitable hardware and software. In other words, the filter may be assigned to a processor on which the respective software runs that provides the filter established by software.

In some embodiments, the frequency response may be filtered automatically, i.e. the "frequencies" or rather periodic repetitions $t_i$ that are to be removed from the response function are chosen automatically.

Alternatively or additionally, a user may choose the periodic repetitions or rather "frequencies" $t_i$ that are to be removed from the response function, for example based on the identified peak positions and/or the associated electrical lengths and/or mechanical lengths.

In a further embodiment of the present disclosure, a device under test having a known actual response function is used, and wherein the actual response function is compared with the determined response function. This way, the measurement system can be calibrated, because periodic components that correspond to intrinsic system errors of the particular measurement system can be identified.

Correction parameters for the measurement system may be determined based on the comparison of the actual response function with the determined response function. The correction parameters comprise information on periodic components present in the determined response function that are not present in the actual response function. In other words, the correction parameters comprise information on the intrinsic system errors of the particular measurement system. This information can be used for automatically correcting response functions of other devices under test.

In some embodiments, a corrected response function of another device under test is determined based on the correction parameters. Thus, transmission measurements of other devices under test may be automatically corrected for the system errors based on the determined correction parameters.

Embodiments of the present disclosure further provide a measurement system. In an embodiment, the system comprises a signal generator, a signal analyzer and a device under test. The signal generator is configured to generate a test signal having predetermined properties. The signal generator is configured to forward the test signal to the device under test. The signal analyzer is configured to receive a transmission signal from the device under test. The signal analyzer is configured to determine a response function of the device under test based on the test signal and based on the transmission signal. The signal analyzer is configured to determine at least one periodic component of the response function.

Regarding the advantages and further characteristics of the measurement system, reference is made to the explanations given above concerning the method for identifying and/or compensating for system errors, which also hold for the measurement system and vice versa.

In some embodiments, the measurement system is configured to perform the method for identifying and/or compensating for system errors described above.

The signal generator may be established as a vector signal generator being configured to generate a test signal with a predefined amplitude and phase.

The signal analyzer may be established as a vector signal analyzer being configured to determine an amplitude and a phase of a signal received by the signal analyzer.

In some embodiments, the signal analyzer is not established as a vector network analyzer. In other words, the measurement system only comprises a single receiver, namely the signal analyzer.

According to one aspect of the present disclosure, the response function is a frequency response and/or a transfer function. If the device under test exhibits a linear time invariant behavior, usually the frequency response of the device under test is determined. If the device under test deviates from the linear time invariant behavior, the transfer function is the more appropriate tool to describe the behavior of the device under test.

According to another aspect of the present disclosure, the signal analyzer is configured to determine a transformed response function in order to determine the at least one periodic component, the transformed response function being a Fourier transform or a Laplace transform of the response function. Note that the response function is a function in frequency domain. Accordingly, both the Fourier transform and the Laplace transform of the response function may be functions in time domain. Periodic components of the response function thus have certain "frequencies" or rather periodic repetitions $t_i$ because the frequency composition of a function in frequency domain is described by its Fourier transform or Laplace transform.

According to another aspect of the present disclosure, the signal analyzer is configured to determine an amplitude response, a phase response and/or a group delay based on the response function. Further, a Fourier transform or a Laplace transform of the amplitude response, the phase response and/or the group delay may be determined by the signal analyzer in order to determine at least one periodic component of the amplitude response, the phase response and/or the group delay. System errors due to reflections in the measurement system are associated with periodic components in the determined amplitude response, the determined phase response and/or the determined group delay. Accordingly, by identifying the periodic components of the amplitude response, the phase response and/or the group delay, the system errors are identified appropriately.

In one embodiment of the present disclosure, the signal analyzer is configured to perform a peak search on the transformed response function, thereby determining peak positions of peaks in the transformed response function. Periodic components of the response function in frequency domain are associated with peaks of the Fourier transformed response function and/or the Laplace transformed response function. Any known and/or suitable peak search algorithm may be used.

The signal analyzer may be configured to determine an electrical length and/or a mechanical length of at least one component of the measurement system based on the determined peak positions. Accordingly, a phase shift (electrical length) caused by the reflections and/or a distance that a signal has to travel due the reflections is determined.

The measurement system may further comprise a display, wherein the signal analyzer is configured to display the electrical length and/or the mechanical length on the display. This may help a user with identifying the source of a system error. For example, if the determined mechanical length associated with a peak is 0.5 m, it is highly probable that the source of the associated reflection is a cable in the measurement system.

According to another aspect of the present disclosure, the signal analyzer is configured to filter the response function with a frequency selective filter in order to remove predetermined frequency ranges from the response function. Accordingly, the contributions of the system errors, particularly of the reflections in the measurement system are removed from the determined response function, thereby recovering the actual response function of the device under test.

The frequency selective filter may be established as a band-pass filter having a predetermined bandwidth or as a low-pass filter having a predetermined bandwidth Accordingly, the contributions of the system errors in the predetermined bandwidth, particularly of the reflections in the measurement system, are removed from the determined response function, thereby recovering the actual response function of the device under test.

According to another aspect of the present disclosure, the frequency selective filter is established as at least one of hardware and software. In other words, the frequency selective filter may be established as a pure hardware filter, as a pure software filter or as a combination of suitable hardware and software.

Embodiments of the present disclosure further provide a calibration system, comprising a signal generator, a signal analyzer and a device under test, wherein the device under test has a known actual response function. The signal generator is configured to generate a test signal having predetermined properties. The signal generator is configured to forward the test signal to the device under test. The signal analyzer is configured to receiving a transmission signal from the device under test. The signal analyzer is configured to determine a response function of the device under test based on the test signal and based on the transmission signal. The signal analyzer is configured to compare the actual response function with the determined response function. This way, the measurement system can be calibrated, because periodic components that correspond to intrinsic system errors of the particular measurement system can be identified.

According to one aspect of the present disclosure, the signal analyzer is configured to determine correction parameters for the measurement system based on the comparison of the actual response function with the determined response function. The correction parameters comprise information on periodic components present in the determined response function that are not present in the actual response function. In other words, the correction parameters comprise information on the intrinsic system errors of the particular measurement system. This information can be used for automatically correcting response functions of other devices under test.

In a further embodiment of the present disclosure, the signal analyzer is configured to save the determined correction parameters for use with another device under test. Thus, transmission measurements of other devices under test may be automatically corrected for the system errors based on the determined correction parameters.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
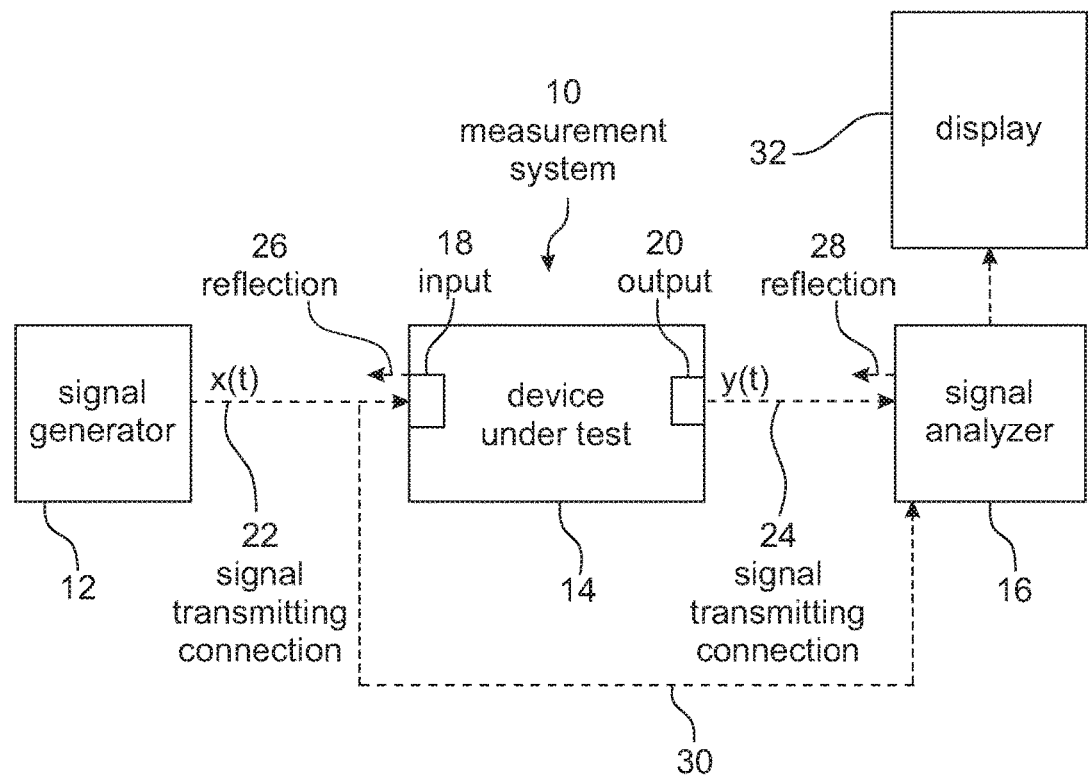
FIG. 1 schematically shows a block diagram of a representative measurement system according to the disclosure.

FIG. 1 shows a measurement system 10 comprising a signal generator 12, a device under test 14 and a signal analyzer 16.

The signal generator 12 may be established as a vector signal generator being configured to generate a test signal with predefined amplitude and phase. Similarly, the signal analyzer 16 may be established as a vector signal analyzer being configured to determine an amplitude and a phase of a signal received by the signal analyzer 16. In some embodiments, the signal analyzer 16 is not established as a vector network analyzer. In other words, the measurement system 10 only comprises a single receiver, namely the signal analyzer 16.

The signal generator 12 and the signal analyzer 16 each are connected to the device under test 14 in a signal-transmitting manner, as indicated by the dashed lines in FIG. 1. More precisely, the signal generator 12 is connected to an input 18 of the device under test 14, while the signal analyzer 16 is connected to an output 20 of the device under test 14. In some embodiments, the signal analyzer 16 is only connected to the output 20 of the device under test 20, i.e. not to the input 18 of the device under test.

The signal-transmitting connections 22, 24 between the signal generator 12 and the device under test 14 on one hand and between the device under test 14 and the signal analyzer 16 on the other hand may each be established as a suitable electrical cable or as a wireless connection employing any communication protocol known in the state of the art.

Generally speaking, the measurement system 10 is configured to perform transmission measurements on the device under test 14 for testing properties of the device under test 14.

The signal generator 12 generates a test signal with predetermined properties, i.e. with predetermined amplitude and phase. The test signal is transmitted to the device under test 14 and processed by the device under test 14, which generates a corresponding output signal. The output signal is transmitted to the signal analyzer 16 and analyzed by the signal analyzer 16 in order to test the above-mentioned properties of the device under test 14.

However, errors may occur in the procedure described above due to reflections that occur in the measurement system 10, wherein these errors are also called system errors.

Generally speaking, reflections occur if an electrical signal travels through two adjacent components that have impedances being different from each other. This typically occurs when two separately formed components are interconnected with each other. Two such reflections are exemplarily illustrated in a schematic manner by the dotted arrows 26, 28 in FIG. 1.

For example, if the connections 22, 24 are established as cables, such reflections may occur at connecting planes between the connections 22, 24 and the device under test 14 or the signal analyzer 16, respectively.

Figure 2:
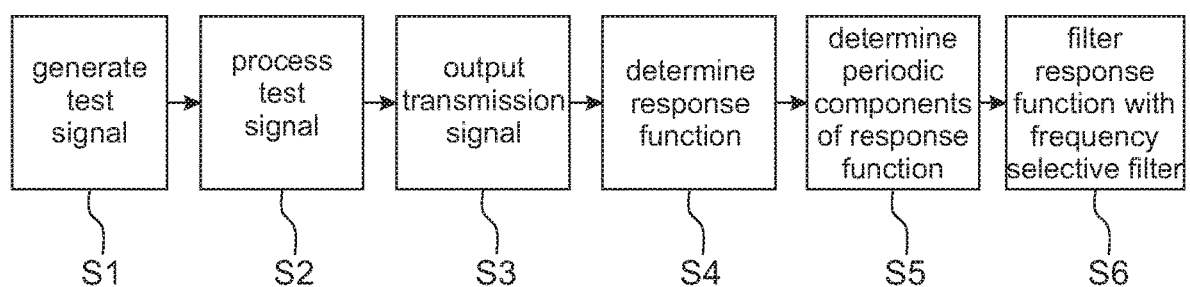
FIG. 2 shows a flow chart of a representative method for at least one of identifying and compensating for system errors according to the disclosure.

In order to identify and/or compensate these system errors, the measurement system 10 is configured to perform the method explained in the following with reference to FIG. 2.

A test signal x(t) having predefined properties is generated by the signal generator 12 (step S1). In other words, the parameters of the test signal that are relevant for the method described in the following are known. For example, one, several or all of the following signal parameters of the test signal are known: amplitude, phase, average power, peak to average ratio, etc.

The test signal is forwarded to the device under test 14 and processed by the device under test 14 (step S2). As a result of step S2, a transmission signal y(t) is generated by the device under test 14.

The transmission signal y(t) is outputted by the device under test 14, forwarded to and received by the signal analyzer 16 (step S3). Moreover, as indicated by the dashed line 30, the test signal x(t) is also forwarded to the signal analyzer 16 (directly).

The signal analyzer 16 determines a response function of the device under test 14 based on the test signal x(t), namely the directly received test signal x(t), and based on the transmission signal y(t) received from the device under test 14 (step S4).

Generally speaking, the response function describes a response of the device under test 14 to the test signal x(t). In other words, the response function comprises information on a correlation between an output signal of the device under test 14, namely the test signal x(t), and an input signal of the device under test 14, namely the transmission signal y(t). More precisely, the response function may be at least one of a frequency response and a transfer function.

Without loss of generality, the case of the response function being a frequency response $H(\omega)$ is described in the following.

The frequency response $H(\omega)$ may be determined by Fourier transforming the transmission signal y(t) and the test signal x(t), thereby obtaining the Fourier transformed transmission signal $Y(\omega)$ and the Fourier transformed test signal $X(\omega)$. Then, the response function $H(\omega)$ is given by the ratio of the Fourier transformed transmission signal $Y(\omega)$ and the Fourier transformed test signal $X(\omega)$, i.e. $H(\omega)=Y(\omega)/X(\omega)$.

The Fourier transformed transmission signal $Y(\omega)$ and the Fourier transformed test signal $X(\omega)$ may each be calculated via a fast Fourier transform (FFT).

It is noted that in the case of the response function being a transfer function, the Fourier transforms described above have to be replaced with Laplace transformations.

The respective transforms are determined by the signal analyzer 16 receiving the transmission signal y(t) and the test signal x(t). Accordingly, the signal analyzer 16 is also configured to calculate the respective response function $H(\omega)$.

Due to the reflections in the measurement system 10, the determined frequency response is not the actual frequency response $H_0(\omega)$ of the device under test 14, but rather comprises contributions from the reflections in the measurement system 10, namely so-called system errors.

It has been found that the reflections causing the above-mentioned errors are associated with periodic components of the frequency response $H(\omega)$.

Accordingly, periodic components of the determined frequency response $H(\omega)$ are determined in order to identify the system errors (step S5).

One possibility to identify periodic components of the frequency response $H(\omega)$ is to determine the Fourier transform $\tilde{h}(\tilde{t})$ of $H(\omega)$, wherein $\tilde{h}(\tilde{t})$ will be called a "transformed frequency response" in the following, and wherein $\tilde{t}$ is the Fourier-conjugate variable of $\omega$.

Periodic components of the frequency response $H(\omega)$ in frequency domain are associated with peaks of the transformed frequency response $\tilde{h}(\tilde{t})$. Accordingly, a peak search is performed on the Fourier transformed frequency response, wherein any known and/or suitable peak search algorithm may be used. This way, peak positions of peaks in the transformed frequency response $\tilde{h}(\tilde{t})$ are identified.

For example, the peaks may be identified by searching the Fourier transformed response function and/or the Laplace transformed response function for local maxima and/or for global maxima. In other words, the peaks may be identified by searching for the highest values of the Fourier transformed response function and/or the Laplace transformed response function.

Additionally or alternatively, the peaks may be identified by analyzing a percentage of total area under a graph of the Fourier transformed response function and/or the Laplace transformed response function. This property can be used to identify the peaks because, generally speaking, the percentage of total area under a graph is higher in the region where a peak of the Fourier transformed response function and/or of the Laplace transformed response function is located.

Moreover, for each of the identified peak positions, an associated electrical length and/or an associated mechanical length may be determined. Generally speaking, if a peak is identified at $t_{peak}$, the corresponding mechanical length may be determined as the product $t_{peak} \cdot c_{sig}$, wherein $c_{sig}$ is the speed of travel of signals through the connections 22, 24, i.e. usually the speed of light. The corresponding electrical length is the phase shift of a signal that travels that mechanical length.

The identified peak positions and/or the associated electrical lengths and/or mechanical lengths may be displayed on a display 32 of the measurement system 10. This may help a user with identifying the source of a system error. For example, if the determined mechanical length associated with a peak is 0.5 m, it is highly probable that the source of the associated reflection is a cable in the measurement system 10.

As explained above, periodic components of the frequency response $H(\omega)$ are identified by performing the peak search.

In order to remove contributions from system errors due to the reflections in the measurement system 10 from the frequency response $H(\omega)$ of the device under test 14, the determined frequency response $H(\omega)$ is filtered with a suitable frequency selective filter (step S6).

More precisely, the frequency response $H(\omega)$ is filtered with a frequency selective filter that removes periodic contributions around central "frequencies" or rather periodic repetitions $t_i$ (the frequency composition of a function in frequency domain, in particular of $H(\omega)$, is described by its Fourier transform) with a respective "bandwidth" of $\Delta t_i$.

The frequency selective filter may be established as a band-pass filter having a predetermined bandwidth or as a low-pass filter having a predetermined bandwidth The frequency selective filter may be established as at least one of hardware and software. In other words, the frequency selective filter may be established as a pure hardware filter, as a pure software filter or as a combination of suitable hardware and software.

In some embodiments, the measurement system 10 may be configured to automatically filter the frequency response $H(\omega)$, i.e. the "frequencies" or rather periodic repetitions $t_i$ that are to be removed are chosen automatically.

Alternatively or additionally, a user of the measurement system 10 may choose the "frequencies" or rather periodic repetitions $t_i$ that are to be removed from the frequency response $H(\omega)$, for example based on the identified peak positions and/or the associated electrical lengths and/or mechanical lengths displayed on the display 32.

As a result of step S6, the actual frequency response $H_0(\omega)$ of the device under test is recovered. Alternatively or additionally, an amplitude response $|H(\omega)|$, a phase response $\varphi(\omega) = \text{Arg}[H(\omega)]$ and/or a group delay $\tau_{gr}(\omega) = d\varphi(\omega)/d\omega$ may be determined based on the frequency response.

Afterwards, periodic components of the amplitude response, the phase response and/or the group delay may be identified analogously to the case described above, i.e. by determining the respective transformed function and performing a peak search.

Summarizing, the measurement system 10 is configured to identify and compensate for system errors in the measurement system 10 due to reflections occurring in the measurement system 10. The method described above is based on the response function, for example the frequency response $H(\omega)$, which is determined via a single receiver, i.e. the signal analyzer 16. There is no need for additional receivers, additional directional elements and/or for a vector network analyzer.

The method described above may also be used to calibrate the measurement system 10 without the device under test 14, i.e. the system comprising the signal generator 12, the signal analyzer 16, and the signal-transmitting connections 22, 24, 30.

For this purpose, a device under test 14 with a known actual response function, for example with a known actual frequency response $H_0(\omega)$ is used in the measurement system 10, which then also may be called a calibration system 10.

Figure 3:
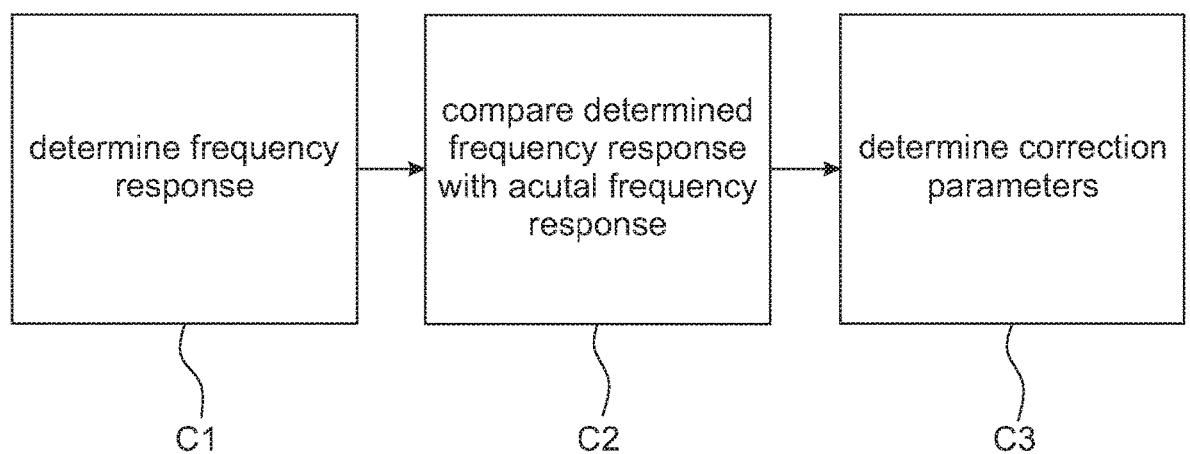
FIG. 3 shows a flow chart of a representative method for calibrating a measurement system according to the disclosure.

In the following, a method for calibrating the measurement system 10 is described with reference to FIG. 3.

The frequency response $H(\omega)$ of the device under test 14 is determined according to the method described above, i.e. by at least performing steps S1 to S4 (step C1).

Then, the determined frequency response $H(\omega)$ is compared with the known actual frequency response $H_0(\omega)$ (step C2). Deviations of the determined frequency response $H(\omega)$ from the known actual frequency response $H_0(\omega)$ are due to system errors, for example due to reflections in the calibration system 10.

The comparison may also be done for the transformed functions, i.e. the Fourier transformed frequency response $\tilde{h}(t)$ and the Fourier transformed actual frequency response $\tilde{h}_0(t)$ may be compared with each other. In other words, the periodic components of the determined frequency response $H(\omega)$ and of the actual frequency response $H_0(\omega)$ are compared with each other.

Based on the comparison, correction parameters are determined (step C3). In some embodiments, the correction parameters comprise information on periodic components present in the determined frequency response $H(\omega)$ that are not present in the actual frequency response $H_0(\omega)$. These are the periodic components that correspond to intrinsic system errors of the particular measurement system 10 without the device under test 14, i.e. that are characteristic for the system comprising the signal generator 12, the signal analyzer 16, and the signal-transmitting connections 22, 24, 30.

These determined correction parameters may then be used to automatically remove the system error that is due to reflections in the measurement system when testing a device under test 14 with an unknown response function.

In other words, a corrected response function for the device under test 14 may be determined automatically based on the determined correction parameters.

Of course, the amplitude response $|H(\omega)|$, the phase response $\varphi(\omega) = \text{Arg}[H(\omega)]$ and/or the group delay $\tau_{gr}(\omega) = d\varphi(\omega)/d\omega$ may also be employed in order to calibrate the measurement system analogously to the method described above.

As described above, the signal generator, the signal analyzer, other components of the measurement system or calibration system, calibration system, and/or other components based on the context provided, may include, in some embodiments, logic for implementing the technologies and methodologies described herein. This logic of these components can be carried out in either hardware or software, or a combination of hardware and software. In some embodiments, one or more of these components includes one or more computing devices such as a processor (e.g., a microprocessor), a central processing unit (CPU), a digital signal processor (DSP), an application-specific integrated circuit (ASIC), a field programmable gate array (FPGA), or the like, or any combinations thereof, and can include discrete digital or analog circuit elements or electronics, or combinations thereof.

In an embodiment, one or more of these components includes a microprocessor and a memory storing logic modules and/or instructions. In an embodiment, one or more of these components includes one or more ASICs having a plurality of predefined logic components. In an embodiment, one or more of these components includes one or more FPGA having a plurality of programmable logic components. In an embodiment, one or more of these components includes hardware circuit implementations (e.g., implementations in analog circuitry, implementations in digital circuitry, and the like, and combinations thereof). In an embodiment, one or more of these components includes combinations of circuits and computer program products having software or firmware instructions stored on one or more computer readable memories that work together to cause a device to perform one or more methodologies or technologies described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for at least one of identifying and compensating for system errors in a measurement system, said measurement system comprising a signal generator and a signal analyzer, comprising:
  generating a test signal via said signal generator, said test signal having one or more properties;
  forwarding said test signal to a device under test;
  processing said test signal via said device under test, thereby generating a transmission signal;
  receiving said transmission signal via said signal analyzer;
  determining a response function of said device under test based on said test signal and based on said transmission signal; and
  determining at least one periodic component of said response function.

2. The method of claim 1, wherein said response function is at least one of a frequency response or a transfer function.

3. The method of claim 1, wherein a transformed response function is determined in order to determine said at least one periodic component, said transformed response function being a Fourier transform or a Laplace transform of said response function.

4. The method of claim 3, wherein a peak search is performed on the transformed response function, thereby determining peak positions of peaks in the transformed response function.

5. The method of claim 4, wherein at least one of an electrical length or a mechanical length of at least one component of said measurement system is determined based on said determined peak positions.

6. The method of claim 5, wherein said at least one of the electrical length or the mechanical length is displayed on a display of said measurement system.

7. The method of claim 1, wherein the response function is filtered with a frequency selective filter in order to remove predetermined frequency ranges from said response function.

8. The method of claim 1, wherein a device under test having a known actual response function is used, and wherein the actual response function is compared with the determined response function.

9. The method of claim 8, wherein correction parameters for the measurement system are determined based on the comparison of the actual response function with the determined response function.

10. The method of claim 9, wherein a corrected response function of another device under test is determined based on the correction parameters.

11. A measurement system, comprising a signal generator, a signal analyzer and a device under test,
  said signal generator being configured to generate a test signal having one or more properties,
  said signal generator being configured to forward said test signal to said device under test,
  said signal analyzer being configured to receive a transmission signal from said device under test,
  said signal analyzer being configured to determine a response function of said device under test based on said test signal and based on said transmission signal, and
  said signal analyzer being configured to determine at least one periodic component of said response function.

12. The measurement system of claim 11, wherein said response function is at least one of a frequency response or a transfer function.

13. The measurement system of claim 11, wherein said signal analyzer is configured to determine a transformed response function in order to determine said at least one periodic component, said transformed response function being a Fourier transform or a Laplace transform of said response function.

14. The measurement system of claim 13, wherein said signal analyzer is configured to perform a peak search on the transformed response function, thereby determining peak positions of peaks in the transformed response function.

15. The measurement system of claim 14, wherein said signal analyzer is configured to determine at least one of an electrical length or a mechanical length of at least one component of said measurement system based on said determined peak positions.

16. The measurement system of claim 15, further comprising a display, wherein said signal analyzer is configured to display said at least one of the electrical length or the mechanical length on said display.

17. The measurement system of claim 15, wherein said signal analyzer is configured to filter the response function with a frequency selective filter in order to remove predetermined frequency ranges from said response function.

18. The measurement system of claim 17, wherein the frequency selective filter is established as at least one of hardware or software.

19. A calibration system, comprising a signal generator, a signal analyzer and a device under test, wherein said device under test has a known actual response function, said signal generator being configured to generate a test signal having a plurality of properties, said signal generator being configured to forward said test signal to said device under test, said signal analyzer being configured to receiving a transmission signal from said device under test, said signal analyzer being configured to determine a response function of said device under test based on said test signal and based on said transmission signal, and said signal analyzer being configured to compare said actual response function with the determined response function.

20. The calibration system of claim 19, wherein the signal analyzer is configured to determine correction parameters for the measurement system based on the comparison of the actual response function with the determined response function and/or wherein said signal analyzer is configured to save the determined correction parameters for use with another device under test.

* * * * *